US 9,722,396 B2

(12) United States Patent
Watanabe et al.

(10) Patent No.: US 9,722,396 B2
(45) Date of Patent: Aug. 1, 2017

(54) SEMICONDUCTOR LASER MODULE

(71) Applicants: Kyoto University, Kyoto-shi, Kyoto (JP); HAMAMATSU PHOTONICS K.K., Hamamatsu-shi, Shizuoka (JP)

(72) Inventors: Akiyoshi Watanabe, Hamamatsu (JP); Yoshitaka Kurosaka, Hamamatsu (JP); Kazuyoshi Hirose, Hamamatsu (JP); Takahiro Sugiyama, Hamamatsu (JP); Susumu Noda, Kyoto (JP)

(73) Assignees: KYOTO UNIVERSITY, Kyoto-shi, Kyoto (JP); HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 15/115,713

(22) PCT Filed: Nov. 10, 2014

(86) PCT No.: PCT/JP2014/079716
§ 371 (c)(1),
(2) Date: Aug. 1, 2016

(87) PCT Pub. No.: WO2015/118741
PCT Pub. Date: Aug. 13, 2015

(65) Prior Publication Data
US 2017/0012407 A1    Jan. 12, 2017

(30) Foreign Application Priority Data

Feb. 6, 2014  (JP) ................................ 2014-021447

(51) Int. Cl.
*H01S 5/10* (2006.01)
*H01S 5/18* (2006.01)
(Continued)

(52) U.S. Cl.
CPC ............ *H01S 5/0683* (2013.01); *H01S 5/022* (2013.01); *H01S 5/105* (2013.01); *H01S 5/18* (2013.01); *H01S 5/187* (2013.01)

(58) Field of Classification Search
None
See application file for complete search history.

(56) References Cited

U.S. PATENT DOCUMENTS

| 8,902,946 B2* | 12/2014 | Chua ........................ H01S 5/18 |
| | | 372/45.01 |
| 2003/0002547 A1* | 1/2003 | Lee ....................... H01S 5/0683 |
| | | 372/29.02 |

FOREIGN PATENT DOCUMENTS

| JP | 4484134 B2 | 6/2010 |
| JP | 2012-134259 A | 7/2012 |
| WO | WO-2013/118358 A1 | 8/2013 |

OTHER PUBLICATIONS

Yoshitaka Kurosaka et al., "Effects non-lasing band in two-dimensional photonic-crystal lasers clarified using omnidirectional band structure," Optics Express, Sep. 7, 2012, pp. 21773-21783, vol. 20, No. 19.

(Continued)

*Primary Examiner* — Michael Carter
(74) *Attorney, Agent, or Firm* — Drinker Biddle & Reath LLP

(57) ABSTRACT

A surface emitting laser element capable of emitting a main beam and a sub-beam, and a monitoring light detection element capable of detecting a light intensity of the sub-beam are included, the surface emitting laser element is a PCSEL, the main beam and the sub-beam are emitted in an upward direction of the surface emitting laser element and are inclined to each other at a predetermined angle, and respective changes in a peak light intensity of the main beam and a peak light intensity of the sub-beam with respect to a (Continued)

value of a driving current of the surface emitting laser element are correlated with each other. Therefore, if an output of the monitoring light detection element indicating the peak light intensity of the sub-beam is used, the peak light intensity of the main beam can be estimated.

5 Claims, 13 Drawing Sheets

(51) Int. Cl.
    *H01S 5/0683*     (2006.01)
    *H01S 5/022*     (2006.01)
    *H01S 5/187*     (2006.01)

(56) References Cited

OTHER PUBLICATIONS

International Preliminary Report on Patentability dated Aug. 18, 2016 for PCT/JP2014/079716.

\* cited by examiner (A)

(B)

(A)

(B)

SEMICONDUCTOR LASER MODULE

TECHNICAL FIELD

The present invention relates to a semiconductor laser module.

BACKGROUND ART

Patent Literature 1 discloses a two-dimensional photonic crystal surface emitting laser. In this two-dimensional photonic crystal surface emitting laser, a photonic crystal periodic structure 21 including a second medium with a different refractive index is arranged in a two-dimensional period in an active layer 12 (a first medium) that emits light due to injection of carriers or near the active layer 12. A lattice structure of a photonic crystal 20 is a square lattice or an orthogonal lattice and has a translational symmetry, but does not have a rotational symmetry. Alternatively, the lattice structure of the photonic crystal 20 is a square lattice or an orthogonal lattice, and is any one of pl, pm, pg or cm in a two-dimensional pattern classification method. A shape of a lattice point may be approximately a triangle.

CITATION LIST

Patent Literature

[Patent Literature 1] Japanese Patent No. 4484134

In the two-dimensional photonic crystal surface emitting laser described in Patent Literature 1, branching a part of a surface emitted laser beam is considered in order to monitor a light intensity of a main beam. However, if a part of the laser beam is branched, a light intensity of the two-dimensional photonic crystal surface emitting laser is degraded and beam quality is also degraded. Accordingly, the present invention has been made in consideration of the above circumstances and one object thereof is, for example, to provide a surface emitting laser capable of monitoring a light intensity of a main beam without degrading the light intensity of the main beam.

SUMMARY OF INVENTION

Technical Problem

A photonic crystal surface emitting laser (PCSEL) is a surface emitting laser and has characteristics in which a single peak beam (main beam) at a beam divergence angle of less than 1 degree in a vertical direction of a light emission surface of the surface emitting laser is obtained as an optical output. The inventor has found a configuration in which a weak sub-beam is obtained in four oblique directions forming an angle of 90 degrees with one another when viewed from an upper portion of a light emitting surface of the PCSEL (alternatively, two oblique directions forming an angle of 180 degrees from each other when viewed from the upper portion of the light emitting surface of the PCSEL), in addition to a main beam in a vertical direction of a device surface, while performing research on various types of PCSELs. As a result of performing intensive research for physical causes for acquisition of the sub-beam in the oblique directions, the inventor has found that the sub-beam is obtained in oblique directions as a result of a portion of the main beam being diffracted with a reflected dispersion relationship of a photonic crystal that is a resonator of the PCSEL by the photonic crystal when the main beam is diffracted in a vertical direction of a light emission surface of a surface emitting laser. Further, as a result of the intensive research, the inventor has found that both of a peak light intensity of the main beam and a peak light intensity of the sub-beam when a current applied to the surface emitting laser is changed monotonously increase, and when one of the peak light intensities is determined, the other can be uniquely determined, from a comparison of both the peak light intensities. That is, by measuring a relationship between both in advance, it is possible to estimate the peak light intensity of the main beam when the peak light intensity of the sub-beam is known. Therefore, when a means for measuring a peak light intensity of the sub-beam is used, it is possible to estimate the peak light intensity of the main beam without degrading the light amount of the main beam.

Solution to Problem

A semiconductor laser module according to a first aspect of the present invention has been made on the basis of the circumstances as described above and includes a surface emitting laser element; a monitoring light detection element; and a storage container, wherein the storage container includes an upper wall and a bottom wall, the storage container stores the surface emitting laser element and the monitoring light detection element, the upper wall includes an opening and faces the bottom wall, the surface emitting laser element includes a principal surface, a light emitting region, and a two-dimensional photonic crystal layer, is provided on the bottom wall, emits a main beam and a sub-beam from the light emitting region, and is arranged so that the main beam passes through the opening, the light emitting region is provided on the principal surface, a first optical axis of the main beam extends in a vertical direction of the principal surface, a second optical axis of the sub-beam forms a predetermined angle α with the vertical direction, the two-dimensional photonic crystal layer includes a plurality of hole portions and extends along the principal surface, the plurality of hole portions have the same shape, are arranged in a lattice pattern in the plurality of arrangement directions parallel to the principal surface, and constitute a diffraction lattice, the monitoring light detection element is provided on the upper wall, and is arranged in a portion at which the second optical axis and the upper wall intersect, the monitoring light detection element includes a light incidence surface, the light incidence surface intersects the second optical axis, the first optical axis and the second optical axis are located on the same surface as a reference direction, the reference direction is an arrangement direction in which an interval between adjacent lattices is shortest among a plurality of arrangement directions, and both of a peak light intensity of the main beam and a peak light intensity of the sub-beam monotonically increase with an increase in a driving current of the surface emitting laser element, and when a value of one of the peak light intensity of the main beam and the peak light intensity of the sub-beam is determined, a value of the other can be uniquely determined. The surface emitting laser element outputs a main beam corresponding to a single peak beam, and a sub-beam corresponding to weak light, and the monitoring light detection element detects the light intensity of the sub-beam. Therefore, since the sub-beam can be used to monitor the light intensity of the main beam when an output of the monitoring light detection element is used, it is possible to estimate the peak light intensity of the main beam without degrading the light amount of the main beam.

In a semiconductor laser module according to a second aspect of the present invention, the semiconductor laser module according to the first aspect further includes a driving device and a display device, the driving device is connected to the surface emitting laser element, and outputs the driving current to the surface emitting laser element, and the display device is connected to the monitoring light detection element, and displays content of a light intensity signal output from the monitoring light detection element. Since the display device can display the light intensity of the sub-beam, an operator of the semiconductor laser module can perform control of the driving signal for the surface emitting laser element (a driving current of the surface emitting laser element) using the driving device while referring to display content of the display device.

In the semiconductor laser module according to a third aspect of the present invention, the semiconductor laser module according to the first aspect further includes a driving device and a control device, the driving device is connected to the surface emitting laser element, and outputs the driving current to the surface emitting laser element, and the control device is connected to the monitoring light detection element and the driving device, and outputs a control signal for the driving device to the driving device based on a light intensity signal output from the monitoring light detection element. Since the control circuit can control the operation of the driving device on the basis of the light intensity of the sub-beam, control of the driving signal for the surface emitting laser element (the driving current of the surface emitting laser element) is automatically performed on the basis of the light intensity of the sub-beam.

In a semiconductor laser module according to a fourth aspect of the present invention, when the diffraction lattice is a square lattice, a lattice interval of the diffraction lattice substantially matches an oscillation wavelength of the surface emitting laser element, and the surface emitting laser element oscillates at a second of four light bands derived from the square lattice, on a long wavelength side. Thus, when the diffraction lattice is the square lattice, the surface emitting laser element oscillates at the second of the four light bands derived from the square lattice, on the long wavelength side.

In the semiconductor laser module according to a fifth aspect of the present invention, the surface emitting laser element includes an active layer, a shape of a bottom surface of the hole portion is a right triangle, and the hole portion has a different refractive index from a refractive index of a base material of the diffraction lattice. In this case, for example, when the diffraction lattice is a square lattice, oscillation occurs at a second of four light bands derived from the square lattice, on a long wavelength side, in the surface emitting laser element, and the surface emitting laser element can output a main beam and a sub-beam. In this case, a node of an electromagnetic field of standing waves of the light generated in the diffraction lattice due to light emission of the active layer is substantially at the same position as a centroid of the right triangle of the hole portion, and an extreme value of an intensity of a magnetic field in the electromagnetic field is present around the hole portion.

Advantageous Effects of Invention

According to each of the aspects of the present invention, for example, it is possible to provide a surface emitting laser capable of monitoring a light intensity of a main beam without degrading the light intensity of the main beam.

DESCRIPTION OF EMBODIMENTS

Figure 1:
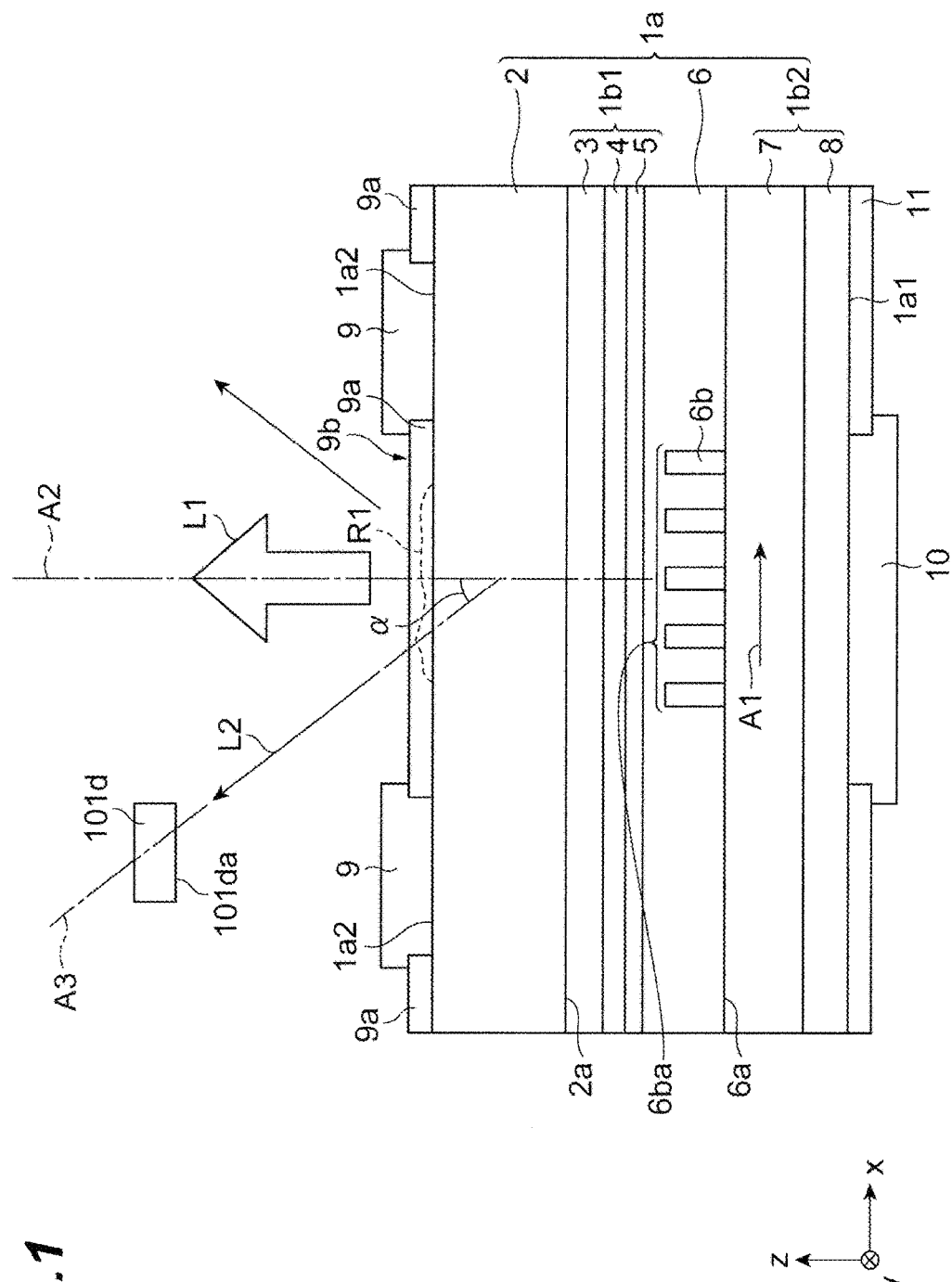
FIG. 1 is a schematic diagram illustrating a configuration of a surface emitting laser element according to an embodiment.

Hereinafter, embodiments according to the present invention will be described in detail with reference to the accompanying drawings. In description of the drawings, the same elements are denoted with the same reference numerals, if possible, and repeated description will be omitted. A configuration of a semiconductor laser module 100 and a configuration of a surface emitting laser element 1 according to the embodiment will be described with reference to FIGS. 1 to 5. In FIG. 1, an orthogonal coordinate system consisting of an x-axis, a y-axis, and a z-axis is illustrated. An arrangement of the x-axis, the y-axis, and the z-axis and the surface emitting laser element 1 (particularly, a diffraction lattice 6ba and a hole portion 6b) is the same in FIGS. 1 to 5.

The surface emitting laser element 1 is a re-growth type photonic crystal surface emitting laser (PCSEL). The surface emitting laser element 1 includes a semiconductor laminate 1a, an AR coat 9a (anti-reflective), an n-side electrode 9, a p-side electrode 10, and an insulating film 11. A material of the semiconductor laminate 1a is, for example, a III-V semiconductor including GaAs. The semiconductor laminate 1a includes a support base 2, a laminate 1b1, a two-dimensional photonic crystal layer 6, and a laminate 1b2. The laminate 1b1 includes an n-type cladding layer 3, an active layer 4, and an electron blocking layer 5. The laminate 1b2 includes a p-type cladding layer 7, and a contact layer 8. The laminate 1b1 is provided on a principal surface 2a of the support base 2. The laminate 1b2 is provided on the two-dimensional photonic crystal layer 6. The two-dimensional photonic crystal layer 6 is provided between the laminate 1b1 and the laminate 1b2. The n-side electrode 9 is provided on a principal surface 1a2 of the surface emitting laser element 1.

The principal surface 1a2 of the surface emitting laser element 1 is a surface of the support base 2 that is on a side opposite the principal surface 2a, and is a side opposite a surface 1a1 of the surface emitting laser element 1. The n-side electrode 9 is in contact with the principal surface 1a2. The n-side electrode 9 has a shape surrounding an opening 9b. The n-side electrode 9 defines the opening 9b. The opening 9b includes a central portion of the principal surface 1a2. The AR coat 9a is provided on the principal surface 1a2. The AR coat 9a is provided in a region other than the n-side electrode 9 on the principal surface 1a2 when viewed in a plan view. The AR coat 9a is in contact with the principal surface 1a2. The p-side electrode 10 is provided on the surface 1a1 (a surface of the contact layer 8) of the semiconductor laminate 1a.

The surface emitting laser element 1 includes a light emitting region R1. The light emitting region R1 is provided on the principal surface 1a2. The light emitting region R1 is formed in the opening 9b. The surface emitting laser element 1 emits a main beam L1 and a sub-beam L2 from the light emitting region R1. A first optical axis A2 of the main beam L1 extends in a vertical direction of the principal surface 1a2, and a second optical axis A3 of the sub-beam L2 forms a predetermined angle α with the vertical direction (or the first optical axis A2) of the principal surface 1a2. When a voltage is applied to the n-side electrode 9 and the p-side electrode 10 to cause a current to flow in the semiconductor laminate 1a, the main beam L1 and the sub-beam L2 are output in an upward direction of the principal surface 1a2 from the light emitting region R1.

The n-type cladding layer 3, the active layer 4, the electron blocking layer 5, the two-dimensional photonic crystal layer 6, the p-type cladding layer 7, and the contact layer 8 are sequentially laminated by epitaxial growth in a direction opposite to the z-axis direction (a normal direction of the principal surface 2a) from the principal surface 2a. The support base 2, the n-type cladding layer 3, the active layer 4, the electron blocking layer 5, the two-dimensional photonic crystal layer 6, the p-type cladding layer 7, and the contact layer 8 extend along an xy plane. The principal surface 1a2 (the surface of the support base 2), the principal surface 2a, a p-side surface 6a of the two-dimensional photonic crystal layer 6, and the surface 1a1 (the surface of the contact layer 8) extend along the xy plane. The n-type cladding layer 3 is in contact with the support base 2 and the active layer 4, the active layer 4 is in contact with the n-type cladding layer 3 and the electron blocking layer 5, the electron blocking layer 5 is in contact with the active layer 4 and the two-dimensional photonic crystal layer 6, the two-dimensional photonic crystal layer 6 is in contact with the electron blocking layer 5 and the p-type cladding layer 7, and the p-type cladding layer 7 is in contact with the two-dimensional photonic crystal layer 6 and the contact layer 8.

The two-dimensional photonic crystal layer 6 includes the diffraction lattice 6ba. The diffraction lattice 6ba has a two-dimensional photonic crystal structure of a square lattice arrangement or a triangular lattice arrangement. In the case of the triangular lattice, a lattice shape of the unit lattice is a parallelogram. The two-dimensional photonic crystal structure of the diffraction lattice 6ba extends along the principal surface 1a2. The two-dimensional photonic crystal structure of the diffraction lattice 6ba is a two-dimensional (xy plane) crystal structure. The diffraction lattice 6ba is provided on a p-side surface 6a of the two-dimensional photonic crystal layer 6. A refractive index of the two-dimensional photonic crystal layer 6 periodically changes in a direction (within the xy plane) extending along the principal surface 1a2 in the diffraction lattice 6ba. The two-dimensional photonic crystal layer 6 includes a plurality of hole portions 6b. The plurality of hole portions 6b have the same shape (a substantially triangular prism shape or cylindrical shape). The plurality of hole portions 6b are periodically provided in a plurality of arrangement directions within the xy plane extending along the principal surface 1a2 in a base material of the diffraction lattice 6ba. That is, a plurality of hole portions 6b are arranged along the square lattice or the triangular lattice of the diffraction lattice 6ba. The plurality of hole portions 6b constitute the diffraction lattice 6ba. The hole portion 6b corresponds to a lattice point of the diffraction lattice 6ba. The hole portion 6b has a refractive index different from the refractive index of the base material of the diffraction lattice 6ba. Due to the plurality of hole portions 6b, the refractive index of the diffraction lattice 6ba periodically changes in a direction (the xy plane) extending along the principal surface 1a2 in light of the same wavelength. The hole portion 6b is provided on the p-side surface 6a of the two-dimensional photonic crystal layer 6, and a shape of the hole portion 6b (which may be a substantially triangular prism or cylindrical shape) extends to the p side (toward the p-side surface 6a) from a bottom surface of the hole portion 6b. A shape of the bottom surface of the hole portion 6b and a shape of an opening (an opening of the hole portion 6b in the p-side surface 6a) of the hole portion 6b (a planar shape of the hole portion 6b) may be the same shape and both be a right triangle or a circle, but a deformation in a manufacturing process is assumed to be allowed.

For example, when the diffraction lattice 6ba is the square lattice, a planar shape of the hole portion 6b (the shape of the bottom surface of the hole portion 6b) being a right triangle (shapes of three vertices are rounded), an aspect ratio of two sides between which a right angle of the right triangle is interposed being equal to or greater than 1.0 and equal to or smaller than 2.0, a filling factor (a ratio (%) of an area of the bottom surface of the hole portion 6b to an area of the unit lattice R2) being equal to or greater than 10% and equal to or smaller than 35%, and a roundness of the three vertices of the right triangle being about 0.10×La (La indicates a lattice interval), oscillation occurs in the second band (B2 illustrated in FIG. 4 to be described below) of four light bands (light bands B1 to B4 illustrated in FIG. 4 to be described below) of the two-dimensional photonic crystal layer 6, on a long wavelength side. In this case, a node of the electromagnetic field of standing waves of the light generated in the diffraction lattice 6ba due to the light emission of the two-dimensional photonic crystal layer 6 (a node R4 of the electromagnetic field illustrated in FIG. 13 to be described below) is at substantially the same position as a centroid of the right triangle of the hole portion 6*b*. In this case, an extreme value of the intensity of the magnetic field in this electromagnetic field is present around the hole portion 6*b*.

Figure 13:
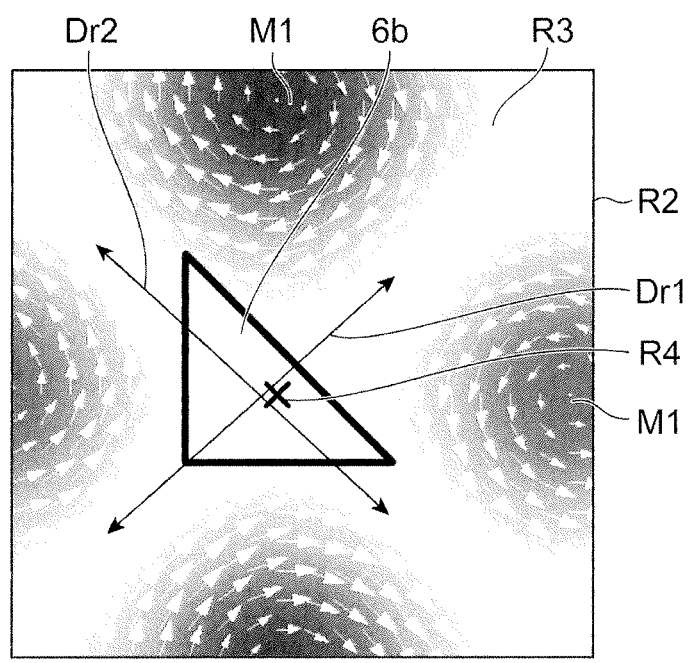
FIG. 13 is a diagram illustrating an electromagnetic field generated by a diffraction lattice of the surface emitting laser element according to the embodiment in a case in which the diffraction lattice is a square lattice and a lattice point is a hole having a planar shape of a right triangle.

FIG. 13 illustrates the hole portion 6*b* arranged in the unit lattice R2, a direction R3 of an electric field in the unit lattice R2, and a magnetic field distribution M1 in the unit lattice R2 in a case in which the diffraction lattice 6*ba* is a square lattice and the planar shape of the hole portion 6*b* (the shape of the bottom surface of the hole portion 6*b*) is a right triangle. The magnetic field distribution M1 is included in the electromagnetic field of the standing waves of the light generated in the diffraction lattice 6*ba* due to the light emission of the active layer 4, shows a substantially circular region in which the intensity of the magnetic field is relatively strong, and includes an extreme value of the intensity of the magnetic field. In the main beam L1 of the surface emitting laser element 1, a node R4 of the electromagnetic field is at substantially the same position as a centroid of the right triangle of the hole portion 6*b* (the shape of the bottom surface of the hole portion 6*b*). In the case of the main beam L1, the magnetic field distribution M1 (an extreme value of intensity of the magnetic field in the electromagnetic field generated in the diffraction lattice 6*ba* due to the light emission of the active layer 4) is present around the hole portion 6*b*. An electric field component of the electric field around the hole portion 6*b* in the case of the main beam L1 is relatively greater in a direction Dr1 intersecting a hypotenuse of the right triangle of the bottom surface of the hole portion 6*b* and a direction Dr2 extending along the hypotenuse.

A material of the support base 2 is, for example, n-type GaAs. A material of the n-type cladding layer 3 is, for example, n-type AlGaAs. A thickness of the n-type cladding layer 3 is, for example, about 2000 [nm]. For example, when an oscillation wavelength of the surface emitting laser element 1 is assumed to be 980 [nm], a refractive index of the n-type cladding layer 3 is about 3.11.

The active layer 4 generates light. The active layer 4 includes, for example, three quantum well layers. A material of the quantum well layer of the active layer 4 is, for example, i-type InGaAs. A material of a barrier layer of the active layer 4 is, for example, i-type AlGaAs. The active layer 4 may include a guide layer that is in contact with the n-type cladding layer 3. A material of the guide layer of the active layer 4 is, for example, i-type AlGaAs. A thickness of the active layer 4 is, for example, about 140 [nm]. A refractive index of the active layer 4 is, for example, about 3.49 when the oscillation wavelength of the surface emitting laser element 1 is 980 [nm].

The electron blocking layer 5 is between the p-type cladding layer 7 of p-type conductivity and the active layer 4. A material of the electron blocking layer 5 is, for example, i-type AlGaAs. The electron blocking layer 5 may include a guide layer which is in contact with the two-dimensional photonic crystal layer 6. A material of the guide layer of the electron blocking layer 5 is, for example, i-type AlGaAs. A thickness of the electron blocking layer 5 is, for example, about 35 [nm]. A refractive index of the electron blocking layer 5 is, for example, about 3.33 when the oscillation wavelength is assumed to be 980 [nm].

The two-dimensional photonic crystal layer 6 is between the p-type cladding layer 7 of p-type conductivity and the active layer 4. The two-dimensional photonic crystal layer 6 includes the diffraction lattice 6*ba* having a two-dimensional photonic crystal structure. The two-dimensional photonic crystal layer 6 further includes a guide layer that is in contact with the electron blocking layer 5. A thickness of the two-dimensional photonic crystal layer 6 is, for example, about 300 [nm]. A material of the guide layer of the two-dimensional photonic crystal layer 6 is, for example, i-type GaAs. A base material of the diffraction lattice 6*ba* is, for example, i-type GaAs or i-type AlGaAs. The diffraction lattice 6*ba* includes the plurality of hole portions 6*b* (cavity). The plurality of hole portions 6*b* are arranged in a lattice form along a plurality of arrangement directions parallel to the principal surface 1*a*2. The plurality of hole portions 6*b* are periodically provided within the xy plane (along the principal surface 1*a*2 and the p-side surface 6*a*) in the base material of the diffraction lattice 6*ba*. Due to the plurality of hole portions 6*b*, a refractive index of the diffraction lattice 6*ba* is periodically changed in a direction extending along the principal surface 1*a*2 (p-side surface 6*a*) in light of the same wavelength. The refractive index of the diffraction lattice 6*ba* can be estimated, for example, using a value of the dielectric constant obtained by assuming the oscillation wavelength of the surface emitting laser element 1 to be 980 [nm], assuming the hole portion 6*b* to be a cavity having the refractive index=1, and averaging the dielectric constant (here, a square of the refractive index) according to an area of the hole portion 6*b* with respect to the surface (a surface region included in the p-side surface 6*a*) of the diffraction lattice 6*ba*. A depth of the hole portion 6*b* is, for example, 200 [nm]. When a thickness of the two-dimensional photonic crystal layer 6 is about 300 [nm] and a depth of the hole portion 6*b* is 300 [nm], the two-dimensional photonic crystal layer 6 does not include a guide layer.

A material of the p-type cladding layer 7 is, for example, p-type AlGaAs. A thickness of the p-type cladding layer 7 is, for example, about 2000 [nm]. A refractive index of the p-type cladding layer 7 is, for example, about 3.27 when the oscillation wavelength of the surface emitting laser element 1 is assumed to be 980 [nm]. A conductivity type of the p-type cladding layer 7 and a conductivity type of the n-type cladding layer 3 are different from each other.

A material of the contact layer 8 is, for example, p-type GaAs. A thickness of the contact layer 8 is, for example, about 200 [nm]. A refractive index of the contact layer 8 is, for example, about 3.52 when the oscillation wavelength of the surface emitting laser element 1 is assumed to be 980 [nm.].

As a material of the n-side electrode 9, a material of an electrode provided on a semiconductor layer of a GaAs-based material is usable. The material of the n-side electrode 9 may be, for example, a mixture of a metal such as Au and a semiconductor such as Ge. The n-side electrode can be, for example, AuGe, AuGe/Au, or the like.

As a material of the p-side electrode 10, a material of an electrode provided on the semiconductor layer of a GaAs-based material may be used. The material of the p-side electrode 10 may be, for example, a metal such as Au, Ti, Pt, or Cr. The p-side electrode 10 may be, for example, Ti/Pt/Au, Ti/Au, or Cr/Au in order from the GaAs semiconductor layer side. An impurity is added to the contact layer 8 that is in contact with the p-side electrode 10 at a high concentration of $1 \times 10^{19}$ [$cm^{-3}$] or more. The p-side electrode 10 has, for example, a square shape, and an area thereof is, for example, about $200 \times 200$ [$\mu m^2$].

A configuration of the diffraction lattice 6*ba* of the two-dimensional photonic crystal layer 6 will be described with reference to FIGS. 2 and 3. Part (a) of FIG. 2 and part (a) of FIG. 3 are diagrams when the diffraction lattice 6*ba* is viewed from the principal surface 1*a*2 side. Part (b) of FIG.

Figure 2:
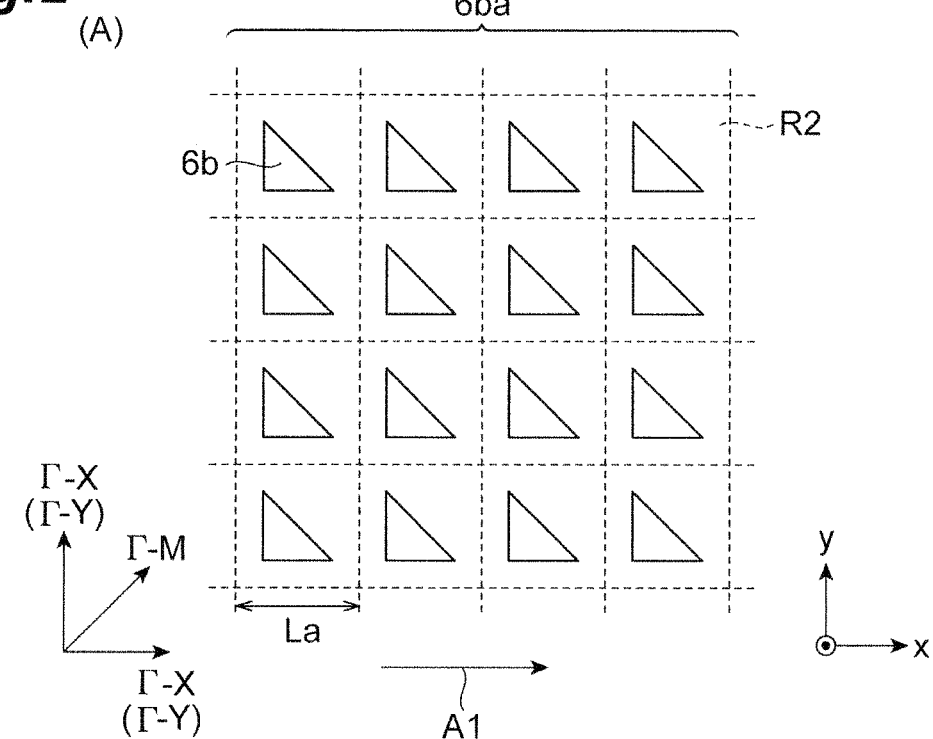
FIG. 2 is a diagram illustrating an example of a configuration of a diffraction lattice of a surface emitting laser element according to the embodiment.
Figure 2:
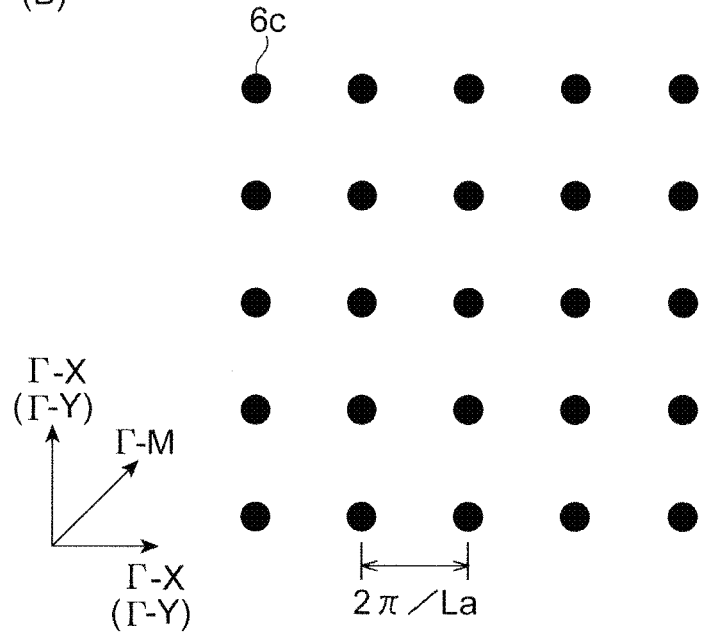
Figure 3:
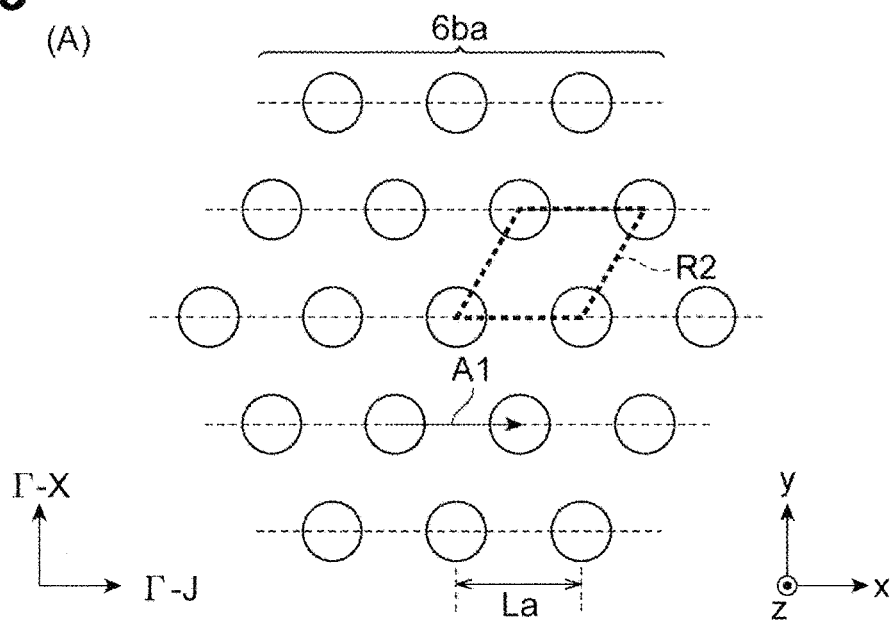
FIG. 3 is a diagram illustrating another example of the configuration of the diffraction lattice of the surface emitting laser element according to the embodiment.
Figure 3:
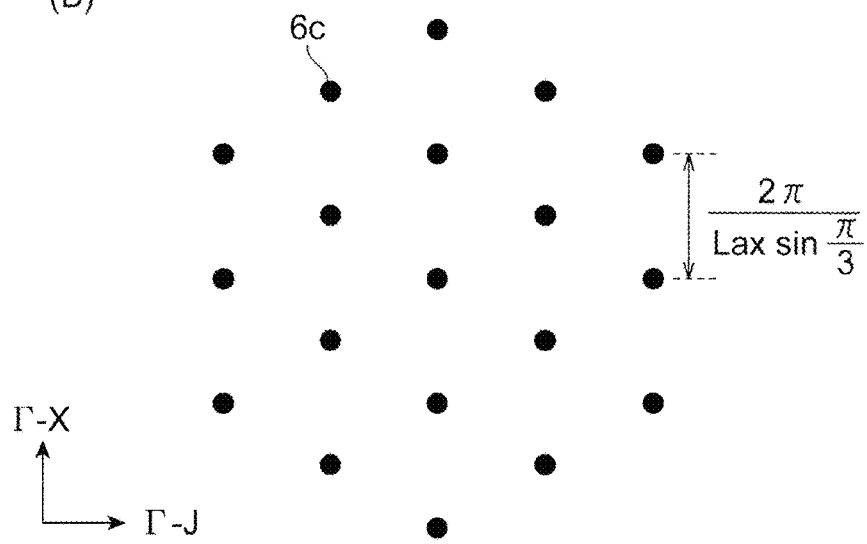

2 illustrates a reciprocal lattice space of the diffraction lattice 6ba illustrated in part (a) of FIG. 2, and part (b) of FIG. 3 illustrates a reciprocal lattice space of the diffraction lattice 6ba illustrated in part (a) of FIG. 3. In part (b) of FIG. 2 and part (b) of FIG. 3, reciprocal lattice points 6c are illustrated. Shapes of the hole portions 6b illustrated in part (a) of FIG. 2 and part (a) of FIG. 3 are shapes of the opening of the hole portion 6b in the p-side surface 6a (cross-sectional surface of the hole portion 6b in the xy plane).

The diffraction lattice 6ba illustrated in part (a) of FIG. 2 is a square lattice. The shape of the unit lattice R2 of the diffraction lattice 6ba illustrated in part (a) of FIG. 2 is a square. An arrangement direction of the unit lattices R2 illustrated in part (a) of FIG. 2 (an arrangement direction of the hole portions 6b) includes a Γ-X direction (Γ-Y direction) and a Γ-M direction. One hole portion 6b is arranged in one unit lattice R2. A direction of a side of a square of the unit lattice R2 illustrated in part (a) of FIG. 2 is a Γ-X direction (Γ-Y direction). A diagonal direction of the unit lattice R2 illustrated in part (a) of FIG. 2 includes the Γ-M direction. The Γ-X direction (Γ-Y direction) illustrated in part (a) of FIG. 2 is parallel to an x-axis or a y-axis. A reference direction A1 illustrated in part (a) of FIG. 2 is parallel to the Γ-X direction (Γ-Y direction). The reference direction A1 illustrated in part (a) of FIG. 2 is an arrangement direction in which an interval between adjacent lattices (a lattice constant) is shortest among a plurality of arrangement directions (the Γ-X direction (Γ-Y direction) and the Γ-M direction) of the hole portions 6b, that is, the Γ-X direction (Γ-Y direction) that is the direction of the side of the squire of the unit lattice R2 illustrated in part (a) of FIG. 2. In the case of part (a) of FIG. 2, the interval between the adjacent lattices is La in the Γ-X direction (Γ-Y direction). In the case of part (a) of FIG. 2, the interval between adjacent lattices in the Γ-M direction is $\sqrt{2} \times La$ (a value obtained by multiplying La by a square root of 2), and is greater than La. The reciprocal lattice points 6c illustrated in part (b) of FIG. 2 are arranged in the Γ-X direction (Γ-Y direction). In the case of part (b) of FIG. 2, the interval between two adjacent reciprocal lattice points 6c is $2\pi/La$ in the Γ-X direction (Γ-Y direction).

The diffraction lattice 6ba illustrated in part (a) of FIG. 3 is a triangular lattice. The shape of the unit lattice R2 of the diffraction lattice 6ba illustrated in part (a) of FIG. 3 is a parallelogram. An arrangement direction of the unit lattices R2 illustrated in part (a) of FIG. 3 (an arrangement direction of the hole portions 6b) includes a Γ-J direction and a Γ-X direction. One hole portion 6b is arranged at each vertex of the parallelogram of the unit lattice R2 illustrated in part (a) of FIG. 3. The Γ-J direction and the Γ-X direction illustrated in part (a) of FIG. 3 are parallel to an x-axis and a y-axis, respectively. A direction of a side of the parallelogram of the unit lattice R2 illustrated in part (a) of FIG. 3 is the Γ-J direction. A direction perpendicular to the side of the parallelogram of the unit lattice R2 illustrated in part (a) of FIG. 3 is the Γ-X direction. A reference direction A1 illustrated in part (a) of FIG. 3 is parallel to the Γ-J direction. A reference direction A1 illustrated in part (a) of FIG. 3 is an arrangement direction in which an interval between adjacent lattices is shortest among a plurality of arrangement directions (the Γ-J direction and the Γ-X direction) of the hole portions 6b, that is, the Γ-J direction that is the direction of the side of the parallelogram of the unit lattice R2 illustrated in part (a) of FIG. 3. In the case of part (a) of FIG. 3, the interval between the adjacent lattices is La in the Γ-J direction. In the case of part (a) of FIG. 3, the adjacent lattice interval in the Γ-X direction is $\sqrt{3} La$ (a value obtained by multiplying La by a square root of 3), and is greater than La. The reciprocal lattice points 6c illustrated in part (b) of FIG. 3 are arranged in the Γ-X direction. In the case of part (b) of FIG. 3, the interval between two adjacent reciprocal lattice points 6c is $2\pi/(La \times \sin(\pi/3))$ in the Γ-X direction.

Figure 4:
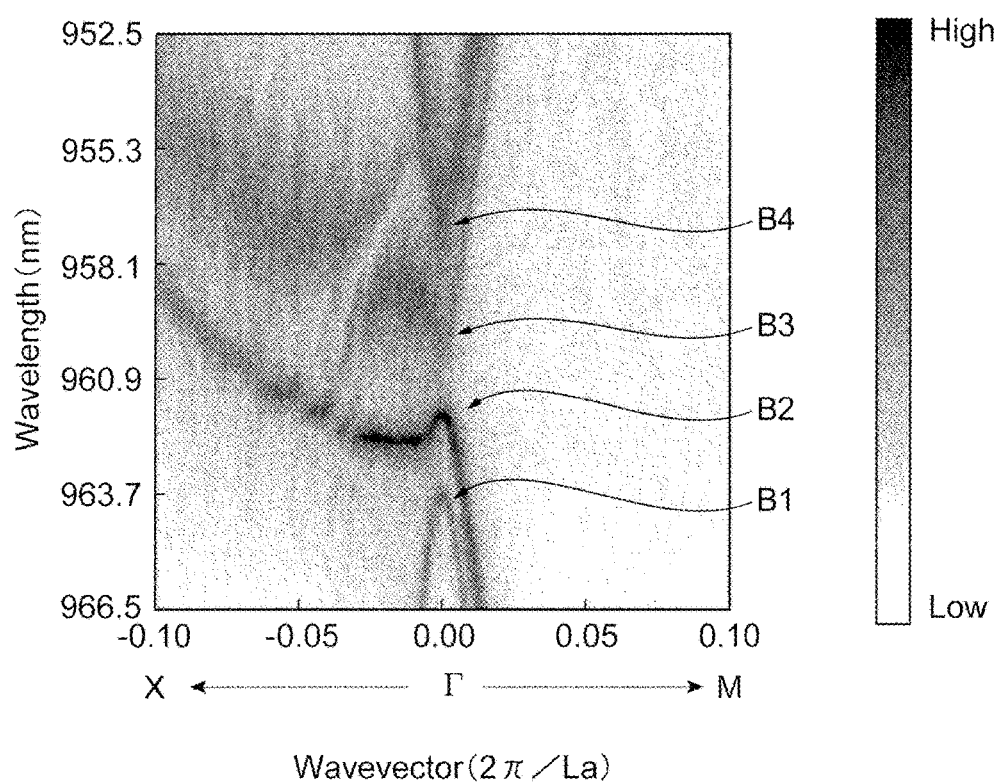
FIG. 4 is a measurement diagram illustrating a main beam of the surface emitting laser element according to the embodiment.

Next, light emitting characteristics of the surface emitting laser element 1 will be described. When the surface emitting laser element 1 has the diffraction lattice 6ba of the square lattice as illustrated in FIG. 2, the lattice interval (La) of the diffraction lattice 6ba substantially matches the oscillation wavelength of the surface emitting laser element 1, and four light bands B1, B2, B3, and B4 (four light bands of the two-dimensional photonic crystal layer 6) derived in the square lattice as illustrated in FIG. 4 are included. FIG. 4 illustrates a plurality of light bands of the surface emitting laser element 1. A horizontal axis of FIG. 4 indicates a wave vector [$2\pi/La$] in a direction along the photonic crystal layer, and a vertical axis in FIG. 4 indicates a wavelength [nm]. Results illustrated in FIGS. 4 to 8 are measurement results for the surface emitting laser element 1 having the diffraction lattice 6ba of the square lattice as illustrated in FIG. 2, but the same applies in the surface emitting laser element 1 having the diffraction lattice 6ba of the triangular lattice as illustrated in FIG. 3. In this case, there are six light bands.

As illustrated in FIG. 4, a shape of the light band B2 in the Γ-X direction is first bent to a long wavelength side and then is bent to a short wavelength side again (is a convex shape toward the bottom) as a distance from a Γ point increases. Accordingly, it can be seen that in the light band B2, a portion in which the frequency is the same as a band end (a portion on the Γ point of the light band is hereinafter referred to as a band end) of the light band B2 is also present near a wave vector 0.045 "$2\pi/La$" in the Γ-X direction.

Figure 5:
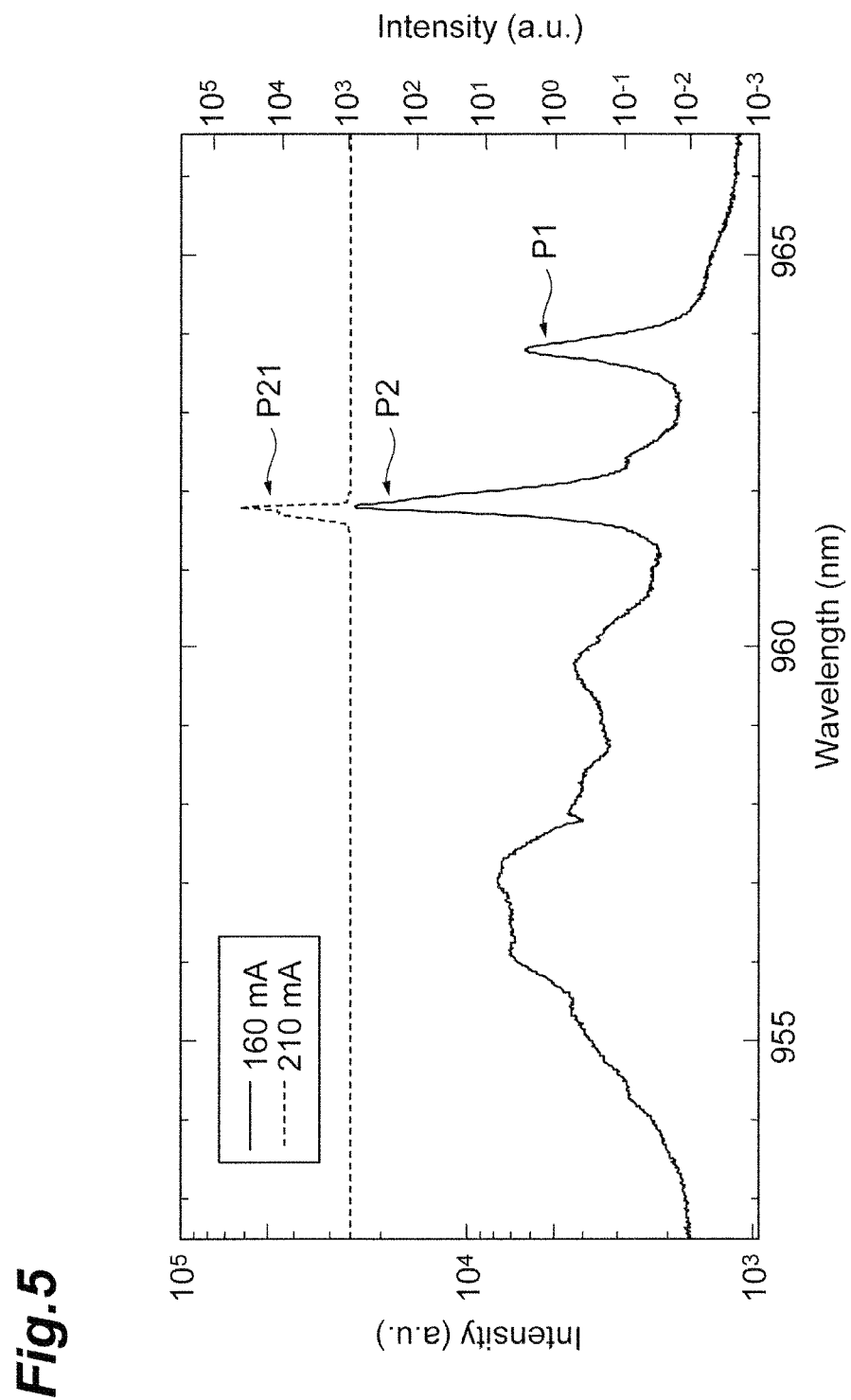
FIG. 5 is a measurement diagram illustrating the main beam of the surface emitting laser element according to the embodiment.

FIG. 5 illustrates a spectrum before and after oscillation of the surface emitting laser element 1. A horizontal axis in FIG. 5 indicates a wavelength [nm], and a vertical axis (left and right) in FIG. 5 indicates light intensity. Peaks P1 and P2 illustrated in FIG. 5 are peaks when a driving current of 160 [mA] is supplied to the surface emitting laser element 1 (before oscillation) and defined by the vertical axis (left) in FIG. 5. The peak P21 illustrated in FIG. 5 is a peak when a driving current of 210 [mA] is supplied to the surface emitting laser element 1 (after oscillation) and defined by the vertical axis (right) in FIG. 5. The peak P2 before oscillation and the peak P21 after oscillation are both located at the same wavelength as the wavelength of a band end of the light band B2, and the peak P1 before oscillation is located at the same wavelength as the wavelength of a band end of the light band B1. It can be seen from this that oscillation occurs from the band end of the light band B2. That is, the oscillation occurs in the second light band B2 of the four light bands B1 to B4 derived from the square lattice, on a long wavelength side. In the oscillation of the surface emitting laser element 1, two beams (a main beam L1 and a sub-beam L2) with the same wavelength as the wavelength of the band end of the light band B2 are output. In this case, the main beam L1 is a beam that is emitted in a vertical direction of the Γ point, that is, the principal surface 1a2, and the sub-beam L2 is a weak beam that is emitted in a direction inclined by an angle α (α is equal to or greater than 7 degrees and equal to or smaller than 9 degrees, such as about 8 degrees) with respect to the vertical direction (alternatively, the first optical axis A2) of the principal surface 1a2 on a surface defined by the vertical direction of the principal surface 1a2 (the first optical axis A2 of the main beam L1) and the reference direction A1 (that is, the Γ-X direction (Γ-Y direction)).

Figure 6:
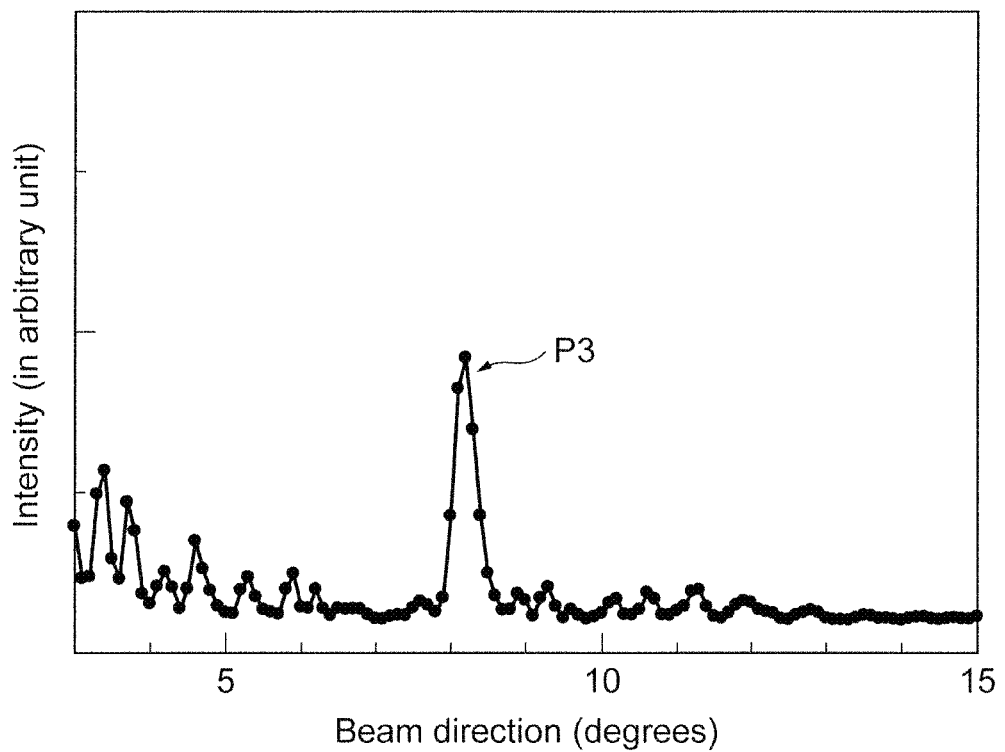
FIG. 6 is a measurement diagram illustrating a sub-beam of the surface emitting laser element according to the embodiment.

For example, a measurement result of the light intensity of emitted light of the surface emitting laser element 1 in the Γ-X direction is illustrated in FIG. 6. A horizontal axis of FIG. 6 indicates a beam direction [degrees] (a slope of the principal surface 1a2 from a vertical direction), and a vertical axis in FIG. 6 indicates the light intensity. It can be seen from FIG. 6 that there is a weak peak P3 in a direction at 7 or more degrees and 9 or less degrees (more specifically, about 8.2 degrees) from the vertical direction of the principal surface 1a2, and this peak P3 corresponds to the sub-beam L2.

Figure 7:
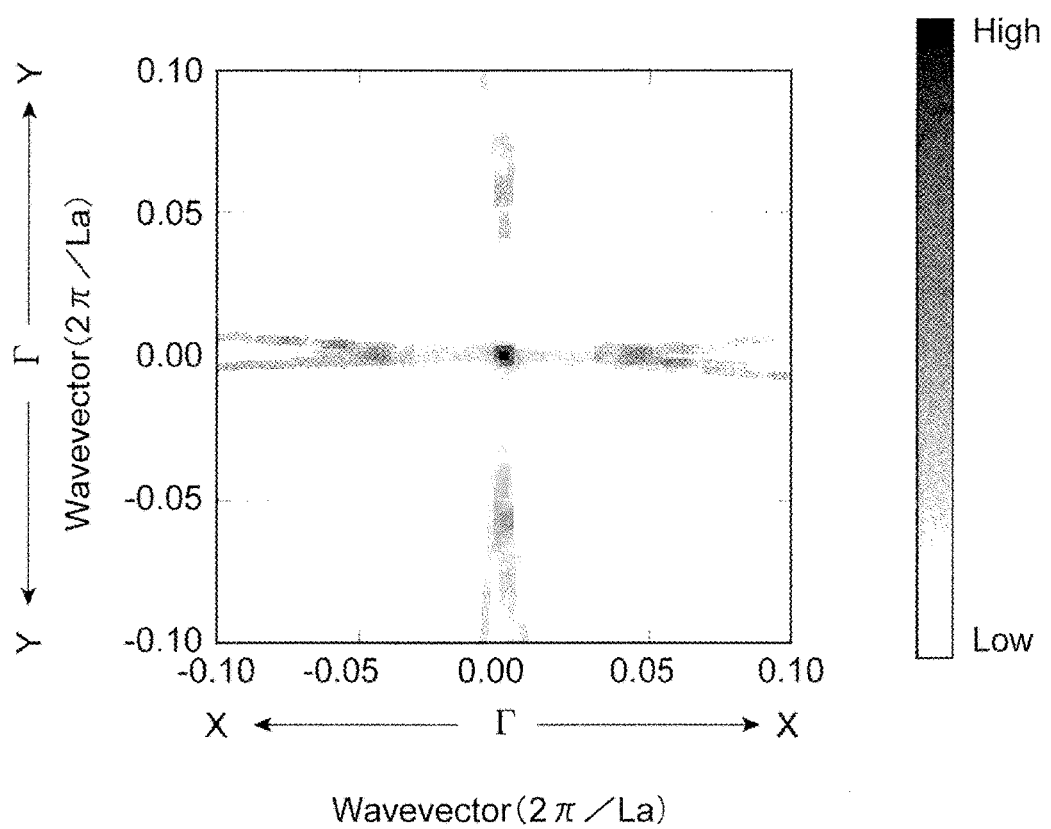
FIG. 7 is a measurement diagram illustrating the sub-beam of the surface emitting laser element according to the embodiment.

Next, a cause of generation of the sub-beam L2 is considered. A result of measuring a light band of the surface emitting laser element 1 in all directions and cutting out and obtaining a cross-section of the same frequency as the band end of the light band B2 is illustrated in FIG. 7. A vertical axis of FIG. 7 indicates a wave vector [2π/La] in a Γ-X direction, and a horizontal axis in FIG. 7 indicates a wave vector [2π/La] in a Γ-Y direction. Light and shaded colors illustrated in FIG. 7 indicate light intensity. The result illustrated in FIG. 7 closely matches a pattern of an actually measured weak sub-beam L2, and is considered to be obtained by the main beam L1 oscillating at a band end of the light band B2 being diffracted by the light band B2 extending in the Γ-X direction and the Γ-Y direction and a weak sub-beam L2 being generated. Generally, since the light band B2 in the square lattice is first bent to a long wavelength side in the Γ-X direction and the Γ-Y direction and then is bent to a short wavelength side again as illustrated in FIG. 4, there is a portion with the same wavelength as the band end in a portion other than a Γ point. That is, in a portion away from the Γ point in the Γ-X direction and the Γ-Y direction in the light band B2, there is a portion with the same wavelength as that of the Γ point. Accordingly, when the oscillation is obtained at the band end of the light band B2, that is, at the Γ point, weak light can be considered to be easily obtained in the Γ-X direction and the Γ-Y direction. Similarly, in the case of the triangular lattice, the weak light can be considered to be easily obtained in the Γ-J direction.

Figure 8:
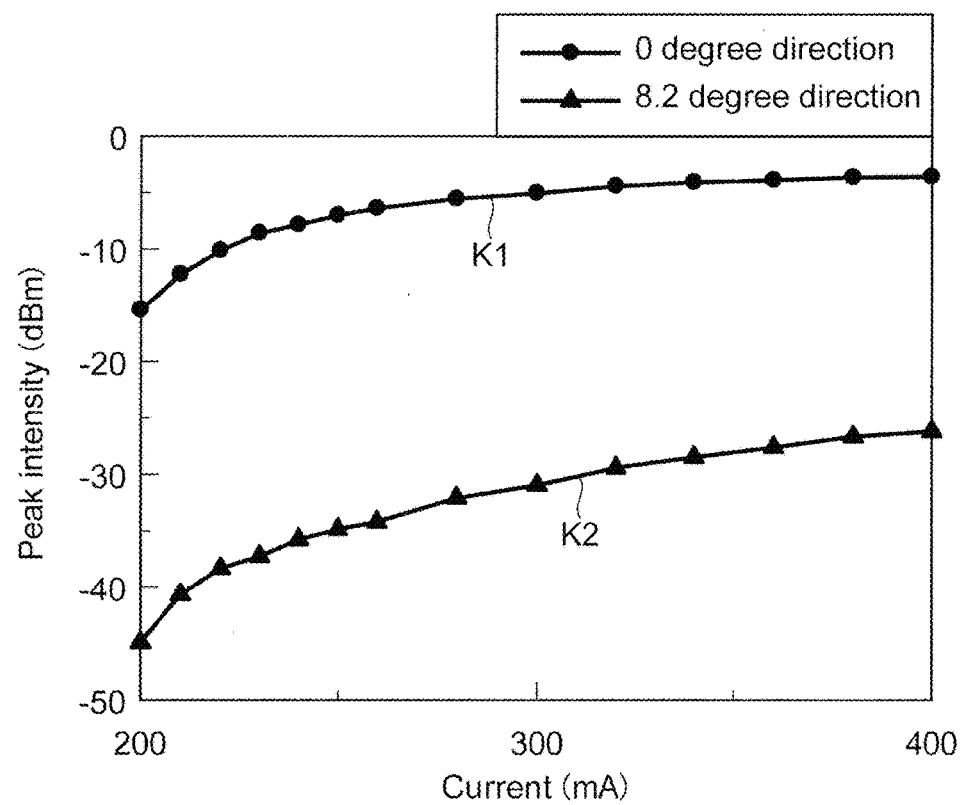
FIG. 8 is a diagram illustrating a correlation between a peak light intensity of a main beam and a peak light intensity of a sub-beam in the surface emitting laser element according to the embodiment.
Figure 9:
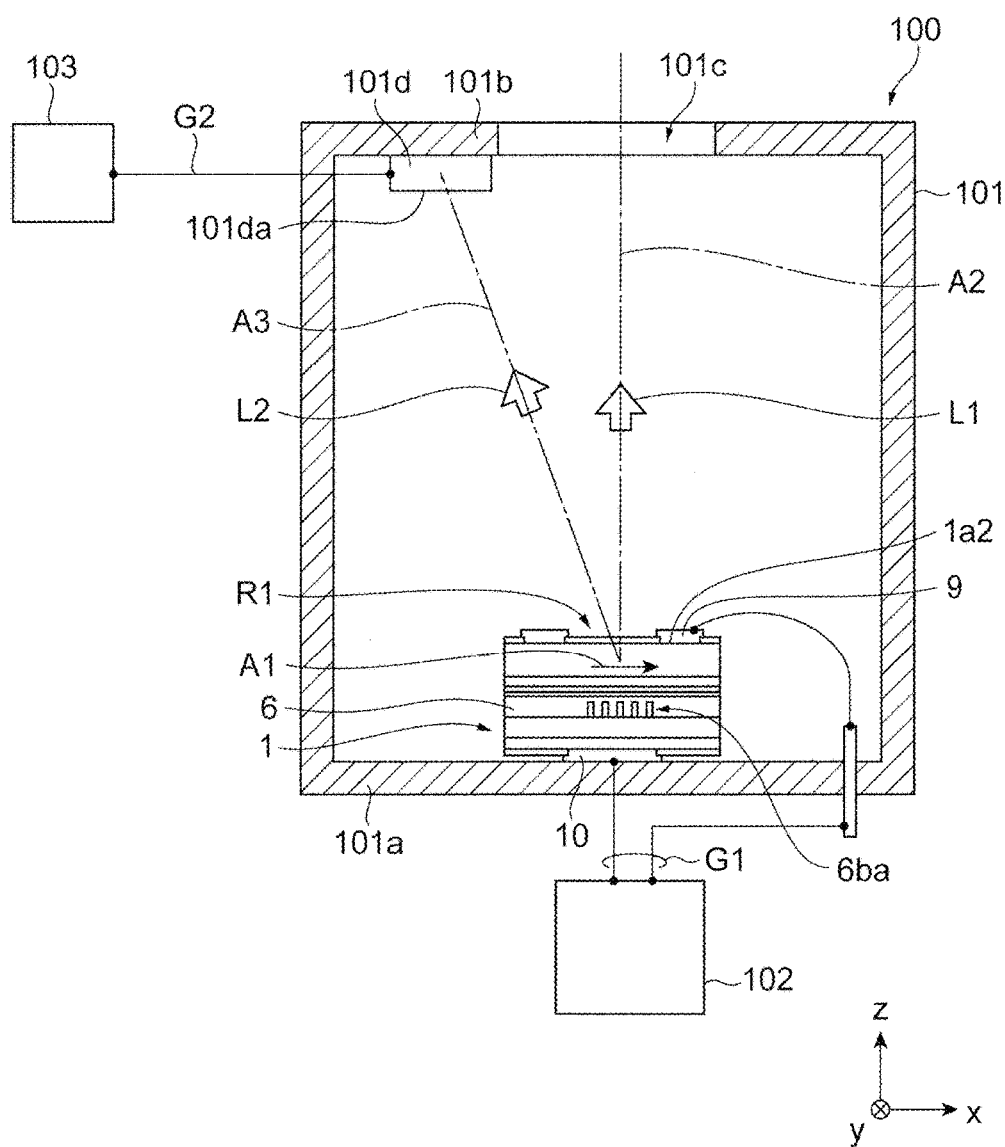
FIG. 9 is a diagram schematically illustrating an example of a configuration of a semiconductor laser module according to the embodiment.
Figure 10:
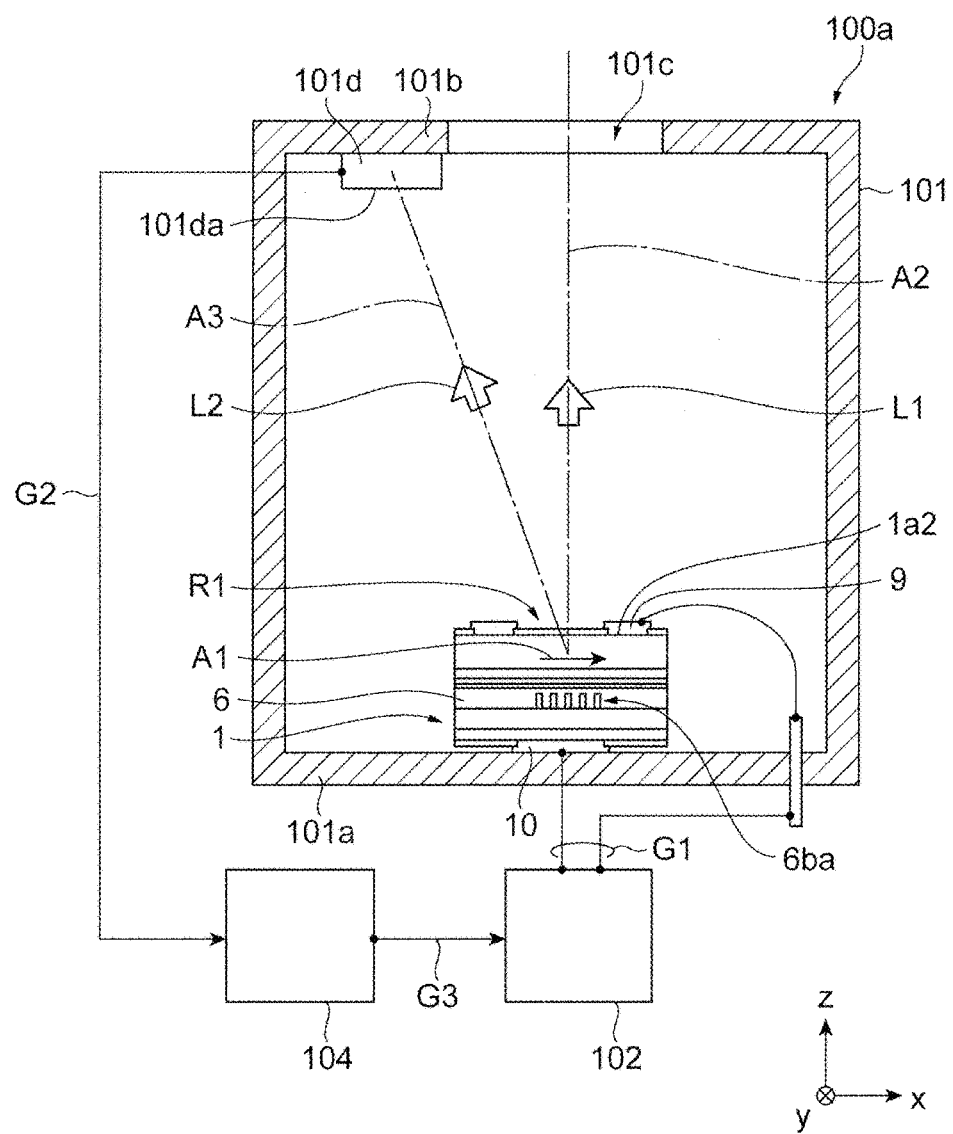
FIG. 10 is a diagram schematically illustrating an example of a configuration of a semiconductor laser module according to the embodiment.

Meanwhile, when a relationship between the peak light intensity (a peak value of the light intensity) of the main beam L1 and the peak light intensity of the weak sub-beam L2 emitted in the vertical direction of the principal surface 1a2 by changing the driving current of the surface emitting laser element 1 is uniquely determined, the sub-beam L2 can be used to monitor the peak light intensity of the main beam L1. From this point of view, a current dependence of the peak light intensity of the main beam L1 and the peak light intensity of the sub-beam L2 when the surface emitting laser element 1 is pulse-driven is measured using an optical spectrum analyzer, and a result of the measurement is illustrated in FIG. 8. A horizontal axis of FIG. 8 indicates the driving current [mA], and a vertical axis in FIG. 8 indicates the peak light intensity [dBm]. As illustrated in FIG. 8, a change in the peak light intensity of the main beam L1 with respect to a change in the driving current of the surface emitting laser element 1 (graph K1) and a change in the peak light strength of the sub-beam L2 with respect to the change in the driving current of the surface emitting laser element 1 (graph K2) are correlated with each other. More specifically, both of the peak light intensity of the main beam L1 and the peak light intensity of the sub-beam L2 monotonically increase with an increase in the driving current, and a uniquely determined relationship between the peak light intensity of the main beam L1 and the peak light intensity of the sub-beam L2 is recognized. The case of pulse driving has been described above by way of example, but the same applies in the case of continuous driving. In other words, when a value (a value of the peak light intensity) of one of the peak light intensity of the main beam L1 and the peak light intensity of the sub-beam L2 is determined, a value (a value of the peak light intensity) of the other can be uniquely determined. Accordingly, by arranging a monitoring photodiode on the second optical axis A3 of the sub-beam L2 and measuring the light intensity of the sub-beam L2 using this monitoring photodiode, it is possible to monitor the peak light intensity of the main beam L1 on the basis of a result of monitoring the peak light intensity of the sub-beam L2. The semiconductor laser modules 100 and 100a illustrated in FIGS. 9 and 10 are modules realized on the basis of the above consideration of light emission characteristics of the surface emitting laser element 1, and the sub-beam L2 is used to monitor the peak light intensity of the main beam L1.

First, the semiconductor laser module 100 illustrated in FIG. 9 will be described. The semiconductor laser module 100 illustrated in FIG. 9 includes the surface emitting laser element 1, a storage container 101, the monitoring light detection element 101d, a driving device 102, and a display device 103. The storage container 101 includes a bottom wall 101a. The storage container 101 includes an upper wall 101b. The storage container 101 stores the surface emitting laser element 1 and the monitoring light detection element 101d. The upper wall 101b has an opening 101c. The upper wall 101b faces the bottom wall 101a. The surface emitting laser element 1 is provided on the bottom wall 101a. The surface emitting laser element 1 is arranged so that the main beam L1 (first optical axis A2) passes through the opening 101c.

The monitoring light detection element 101d is a photodiode. The monitoring light detection element 101d is provided on the upper wall 101b. The monitoring light detection element 101d is arranged in a portion in which the sub-beam L2 (second optical axis A3) and the upper wall 101b intersect. The monitoring light detection element 101d includes a light incidence surface 101da. The light incidence surface 101da intersects the second optical axis A3. The first optical axis A2 and the second optical axis A3 are in the same plane as the reference direction A1.

The driving device 102 is connected to the surface emitting laser element 1. The driving device 102 outputs a driving signal G1 for driving the surface emitting laser element 1 to the surface emitting laser element 1. The driving signal G1 is a driving current. The display device 103 is connected to the monitoring light detection element 101d. The display device 103 displays content (a light intensity value or a spectrum of light intensity) of a light intensity signal G2 that is output from the monitoring light detection element 101d. An operator of the semiconductor laser module 100 operates an operation of the driving device 102 while referring to display content of the display device 103.

A semiconductor laser module 100a illustrated in FIG. 10 is a modification example of the semiconductor laser module 100 illustrated in FIG. 9. The semiconductor laser module 100a includes a surface emitting laser element 1, a storage container 101, a monitoring light detection element 101d, a driving device 102, and a control device 104. The semiconductor laser module 100a includes the control device 104 and does not include the display device 103 of the semiconductor laser module 100. The control device 104 is connected to the monitoring light detection element 101d and the driving device 102. The control device 104 outputs a control signal G3 for the driving device 102 to the driving device 102 based on a light intensity signal G2 output from the monitoring light detection element 101d.

Figure 11:
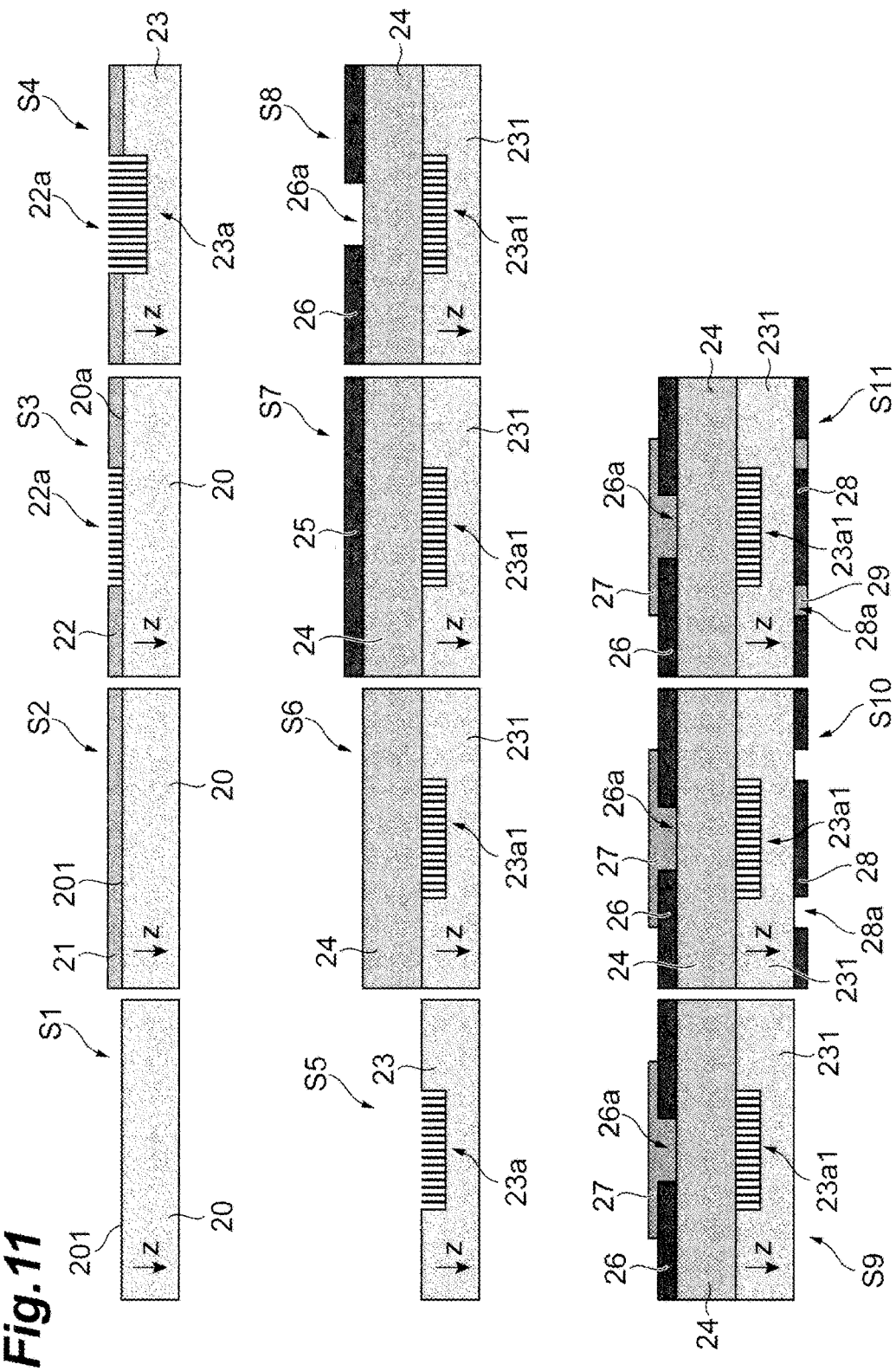
FIG. 11 is a diagram illustrating a main process of a method of manufacturing a surface emitting laser element according to the embodiment.

Next, a method of manufacturing the surface emitting laser element 1 will be described with reference to FIGS. 11 and 12. By sequentially executing respective processes from step S1 to step S11, a substrate product having the configuration of the surface emitting laser element 1 is manufactured. In step S1, a first epitaxial layer structure 20 is grown using MOCVD. A layer structure of the first epitaxial layer structure 20 is illustrated in part (a) of FIG. 12. The first epitaxial layer structure 20 includes a substrate 20a (n-GaAs Substrate), a cladding layer 20b (n-AlGaAs cladding layer), a light guide layer 20c (i-AlGaAs guide layer), a multi-quantum well layer 20d (i-InGaAs/AlGaAs 3QWs), an electron blocking layer 20e (i-AlGaAs carrier blocking layer), a light guide layer 20f (i-AlGaAs guide layer), and a cladding layer 20g (i-GaAs guide layer). The substrate 20a corresponds to the support base 2. The cladding layer 20b corresponds to the n-type cladding layer 3. A layer including the light guide layer 20c and the multi-quantum well layer 20d corresponds to the active layer 4. A layer including the electron blocking layer 20e and the light guide layer 20f corresponds to the electron blocking layer 5. The cladding layer 20g is a layer in which the diffraction lattice 6ba is formed. A surface 201 of the first epitaxial layer structure 20 is a surface of the cladding layer 20g. The surface 201 corresponds to the p-side surface 6a.

In step S2, a resist 21 is applied to the surface 201 of the first epitaxial layer structure 20. In step S3, a photonic crystal pattern 22a is exposed on the resist 21 using an electron beam lithography system and developed with a developing solution. Using this development, the resist 21 becomes a resist 22. The resist 22 includes the photonic crystal pattern 22a.

In step S4, a photonic crystal pattern 23a is transferred to the cladding layer 20g of the surface 201 of the first epitaxial layer structure 20 from the surface 201 side by dry etching. The first epitaxial layer structure 20 becomes a second epitaxial layer structure 23 due to this transfer. The second epitaxial layer structure 23 includes the photonic crystal pattern 23a. A surface on which the photonic crystal pattern 23a is formed in the second epitaxial layer structure 23 corresponds to the p-side surface 6a illustrated in FIG. 1. The photonic crystal pattern 23a and the photonic crystal pattern 22a are the same patterns when viewed from a direction (z-axis direction) perpendicular to the surface 201. A depth of the photonic crystal pattern 23a is about 100 to 300 [nm] from the surface 201, such as about 100 [nm] from the surface 201, about 200 [nm] from the surface 201, or about 300 [nm] from the surface 201 when a thickness of the cladding layer 20g is, for example, about 300 [nm]. In step S4, the cladding layer 20g becomes a layer including an i-GaAs guide layer not including the photonic crystal pattern 23a, and an i-GaAs guide layer including the photonic crystal pattern 23a. Through step S4, the first epitaxial layer structure 20 becomes the second epitaxial layer structure 23. The first epitaxial layer structure 20 includes the cladding layer 20g, whereas the second epitaxial layer structure 23 includes the layer including an i-GaAs guide layer not including the photonic crystal pattern 23a and the i-GaAs guide layer including the photonic crystal pattern 23a and does not include the cladding layer 20g. This difference is the only difference between the first epitaxial layer structure 20 and the second epitaxial layer structure 23. After step S4, the resist 22 is peeled off from the second epitaxial layer structure 23 in step S5.

Figure 12:
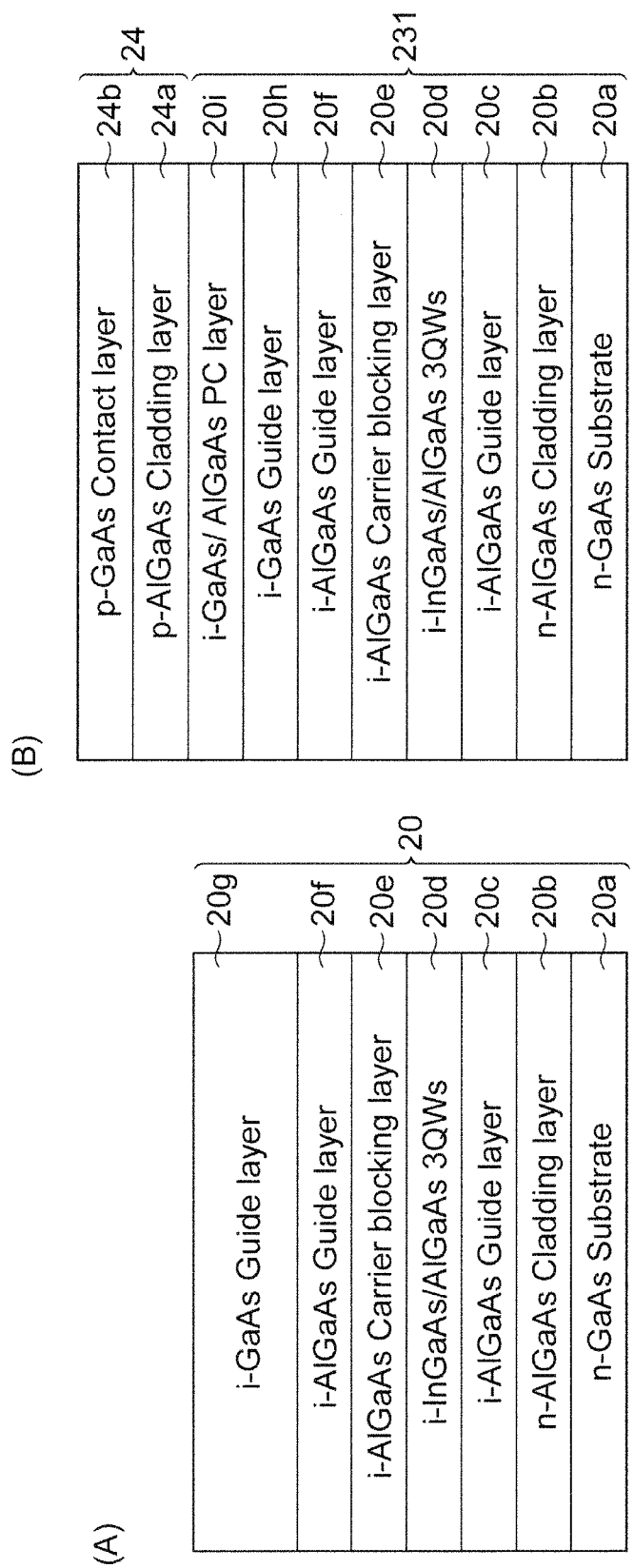
FIG. 12 is a diagram illustrating a main process of a method of manufacturing a surface emitting laser element according to the embodiment.

In step S6, after a general pretreatment is performed, a third epitaxial layer structure 24 illustrated in part (b) of FIG. 12 is grown using a MOCVD method. The third epitaxial layer structure 24 includes a cladding layer 24a (p-AlGaAs cladding layer) and a contact layer 24b (p-GaAs contact layer). The cladding layer 24a is grown on a surface (a surface on which the photonic crystal pattern 23a is formed) of the i-GaAs guide layer of the second epitaxial layer structure 23. In a process of growing the cladding layer 24a, AlGaAs is adhered to the photonic crystal pattern 23a. The i-GaAs guide layer including the photonic crystal pattern 23a and included in the second epitaxial layer structure 23 becomes a photonic crystal layer 20i (which is a i-GaAs/AlGaAs PC layer and corresponds to the diffraction lattice 6ba) containing Al with the growth of the cladding layer 24a. At this time, a cavity (corresponding to the hole portion 6b) is formed inside the photonic crystal layer 20i. The photonic crystal pattern 23a of the second epitaxial layer structure 23 becomes a photonic crystal pattern 23a1 containing AlGaAs and the cavity (corresponding to the hole portion 6b) with the growth of the cladding layer 24a. The photonic crystal layer 20i is a layer including the photonic crystal pattern 23a1. As a result, the cladding layer 20g of the first epitaxial layer structure 20 becomes a layer including the light guide layer 20h (i-GaAs guide layer) and the photonic crystal layer 20i by the transfer of the photonic crystal pattern 23a and the growth of the cladding layer 24a, and the first epitaxial layer structure 20 becomes a fourth epitaxial layer structure 231 through the second epitaxial layer structure 23. The first epitaxial layer structure 20 includes the cladding layer 20g, whereas the fourth epitaxial layer structure 231 includes the layer including the light guide layer 20h and the photonic crystal layer 20i and does not include the cladding layer 20g. This difference is the only between the first epitaxial layer structure 20 and the fourth epitaxial layer structure 231. The layer including the light guide layer 20h and the photonic crystal layer 20i corresponds to the two-dimensional photonic crystal layer 6. The entire epitaxial layer structure of PCSEL (corresponding to the semiconductor laminate 1a of the surface emitting laser element 1) is formed through the processes up to step S6.

In step S7, a SiN layer 25 is formed on a surface (corresponding to the surface 1a1) of the third epitaxial layer structure 24.

In step S8, an opening 26a having a shape corresponding to a p-side electrode 27 (a square shape angled at 200 [μm]) is formed with respect to the SiN layer 25 using typical exposure development technology and reactive ion etching (RIE). Due to the formation of an opening 26a, the SiN layer 25 becomes a SiN layer 26. The SiN layer 26 includes the opening 26a. In the opening 26a, the surface of the third epitaxial layer structure 24 is exposed.

In step S9, the p-side electrode 27 is formed in the opening 26a by lift-off. The p-side electrode 27 comes in contact with the contact layer 24b of the third epitaxial layer structure 24 through the opening 26a. The p-side electrode 27 corresponds to the p-side electrode 10.

As a material of the p-side electrode 27, a material of an electrode provided on the semiconductor layer of a GaAs-based material may be used. The material of the p-side electrode 27 may be, for example, a metal such as Au, Ti, Pt, or Cr. The p-side electrode 27 may be, for example, Ti/Pt/Au, Ti/Au, or Cr/Au in order from the GaAs semiconductor layer side. An impurity is added to the third epitaxial layer structure 24 that is in contact with the p-side electrode 27 at a high concentration of $1 \times 10^{19}$ [cm$^{-3}$] or more.

In step S10, a principal surface 1a2 of the fourth epitaxial layer structure 231 is polished, and a SiN layer 28 is formed in a portion (a portion located immediately under the p-side electrode 27) of the back surface (corresponding to the principal surface 1a2) after polishing using exposure development technology. The SiN layer 28 also includes a function of a non-reflective coat. An optical film thickness of the SiN layer 28 is λ/4 (λ is an oscillation wavelength) of the oscillation wavelength of the surface emitting laser element 1. The SiN layer 28 includes an opening 28a. In the opening 28a, the back surface of the fourth epitaxial layer structure 231 is exposed.

In step S11, an n-side electrode 29 is formed in a shape surrounding a surface emitting region on the back surface of the fourth epitaxial layer structure 231 by lift-off. The n-side electrode 29 corresponds to the n-side electrode 9.

As a material of the n-side electrode 29, a material of the electrode provided on a semiconductor layer of a GaAs-based material is usable. The material of the n-side electrode 29 may be, for example, a mixture of a metal such as Au and a semiconductor such as Ge. The n-side electrode can be, for example, AuGe, AuGe/Au, or the like.

As described above, a substrate product including the configuration of the surface emitting laser element 1 is manufactured by executing the processes including the process of step S1 to the process in step S11. After step S11, the substrate product manufactured through the processes up to step S11 is divided into a plurality of chips of the surface emitting laser element 1.

According to the semiconductor laser modules 100 and 100a having the configuration described above, the surface emitting laser element 1 outputs the main beam L1 corresponding to a single peak beam and the sub-beam L2 corresponding to weak light, and the monitoring light detection element 101d detects the peak light intensity of the sub-beam L2. Therefore, when the output of the monitoring light detection element 101d is used, the sub-beam L2 can be used for monitoring of the peak light intensity of the main beam L1. Accordingly, it is possible to estimate the peak light intensity of the main beam L1 without degrading the light amount of the main beam L1.

In the case of the semiconductor laser module 100, since the display device 103 can display the light intensity (which is a spectrum of the light intensity and is content of the light intensity signal G2) of the sub-beam L2, an operator of the semiconductor laser module 100 can perform the control of the driving signal G1 for the surface emitting laser element 1 (a driving current of the surface emitting laser element 1) via the driving device 102 by referring to display content of the display device 103.

In the case of the semiconductor laser modules 100a, since the control device 104 can control the operation of the driving device 102 based on the light intensity of the sub-beam L2, control of the driving signal G1 for the surface emitting laser element 1 (the driving current of the surface emitting laser element 1) is automatically performed based on the light intensity of the sub-beam L2.

Although the principle of the present invention in the embodiments has been illustrated and described above, those skilled in the art will recognize that arrangements and details in the present invention can be modified without departing from such a principle. The present invention is not limited to the specific configurations disclosed in the present embodiment. Therefore, all modifications and variations within the claims and the spirit thereof are claimed.

REFERENCE SIGNS LIST

1: surface emitting laser element, 10, 27: p-side electrode, 100, 100a: semiconductor laser module, 101: storage container, 101a: bottom wall, 101b: upper wall, 101c: opening, 101d: monitoring light detection element, 101da: light incidence surface, 102: driving device, 103: display device, 104: control device, 11: insulating film, 1a: semiconductor laminate, 1a1: surface, 1a2: principal surface, 1b1, 1b2: laminate, 2: support base, 20: first epitaxial layer structure, 20a: substrate, 20b, 20g, 24a: cladding layer, 20c, 20f, 20h: light guide layer, 20d: multi-quantum well layer, 20e, 5: electron blocking layer, 20i: photonic crystal layer, 21, 22: resist, 22a, 23a, 23a1: photonic crystal pattern, 23: second epitaxial layer structure, 231: fourth epitaxial layer structure, 24: third epitaxial layer structure, 24b: contact layer, 25, 26, 28: SiN layer, 26a, 28a: opening, 29, 9: n-side electrode, 2a: principal surface, 3: n-type cladding layer, 4: active layer, 6: two-dimensional photonic crystal layer, 6a: p-side surface, 6b: hole portion, 6ba: diffraction lattice, 6c: reciprocal lattice point, 7: p-type cladding layer, 8: contact layer, 9a: AR coat, 9b: opening, A1: reference direction, A2: first optical axis, A3: second optical axis, G1: driving signal, G2: light intensity signal, G3: control signal, L1: main beam, L2: sub-beam, M1: magnetic field distribution, K1, K2: graph, R1: light emitting region, R2: unit lattice, R3: direction of electric field, R4: node of electromagnetic field

The invention claimed is:

1. A semiconductor laser module, comprising:
a surface emitting laser element;
a monitoring light detection element; and
a storage container,
wherein the storage container includes an upper wall and a bottom wall,
the storage container stores the surface emitting laser element and the monitoring light detection element,
the upper wall includes an opening and faces the bottom wall,
the surface emitting laser element includes a principal surface, a light emitting region, and a two-dimensional photonic crystal layer, is provided on the bottom wall, emits a main beam and a sub-beam from the light emitting region, and is arranged so that the main beam passes through the opening,
the light emitting region is provided on the principal surface,
a first optical axis of the main beam extends in a vertical direction of the principal surface,
a second optical axis of the sub-beam forms a predetermined angle α with the vertical direction,
the two-dimensional photonic crystal layer includes a plurality of hole portions and extends along the principal surface,
the plurality of hole portions have a same shape, are arranged in a lattice pattern in a plurality of arrangement directions parallel to the principal surface, and constitute a diffraction lattice,
the monitoring light detection element is provided on the upper wall, and is arranged in a portion in which the second optical axis and the upper wall intersect,
the monitoring light detection element includes a light incidence surface,
the light incidence surface intersects the second optical axis,
the first optical axis and the second optical axis are located in a same plane as a reference direction, the reference direction is an arrangement direction in which an interval between adjacent lattices is shortest among the plurality of arrangement directions, and both of a peak light intensity of the main beam and a peak light intensity of the sub-beam monotonically increase with an increase in a driving current of the surface emitting laser element, and when a value of one of the peak light intensity of the main beam and the peak light intensity of the sub-beam is determined, a value of another is uniquely determined.

2. The semiconductor laser module according to claim 1, further comprising:

a driving device and a display device, wherein the driving device is connected to the surface emitting laser element, and outputs the driving current to the surface emitting laser element, and the display device is connected to the monitoring light detection element, and displays content of a light intensity signal output from the monitoring light detection element.

3. The semiconductor laser module according to claim 1, further comprising:

a driving device and a control device, wherein the driving device is connected to the surface emitting laser element, and outputs the driving current to the surface emitting laser element, and the control device is connected to the monitoring light detection element and the driving device, and outputs a control signal for the driving device to the driving device based on a light intensity signal output from the monitoring light detection element.

4. The semiconductor laser module according to claim 1, wherein when the diffraction lattice is a square lattice, a lattice interval of the diffraction lattice substantially matches an oscillation wavelength of the surface emitting laser element, and the surface emitting laser element oscillates at a second of four light bands derived from the square lattice, on a long wavelength side.

5. The semiconductor laser module according to claim 1, wherein the surface emitting laser element includes an active layer, a shape of a bottom surface of each of the hole portions is a right triangle, each of the hole portions has a different refractive index from a refractive index of a base material of the diffraction lattice, a node of an electromagnetic field of standing waves of the light generated in the diffraction lattice due to light emission of the active layer is substantially at a same position as a centroid of the right triangle of the hole portion, and an extreme value of an intensity of a magnetic field in the electromagnetic field is present around each of the hole portions.

* * * * *